United States Patent [19]

Schade, Jr.

[11] 4,219,787
[45] Aug. 26, 1980

[54] RELAXATION OSCILLATOR NOT RESTRICTED BY FET THRESHOLD

[75] Inventor: Otto H. Schade, Jr., North Caldwell, N.J.

[73] Assignee: RCA Corporation, New York, N.Y.

[21] Appl. No.: 958,018

[22] Filed: Nov. 6, 1978

[30] Foreign Application Priority Data

Nov. 25, 1977 [GB] United Kingdom ............... 49126/77
Oct. 24, 1978 [GB] United Kingdom ............... 41751/78

[51] Int. Cl.² ................................................ H03K 3/26
[52] U.S. Cl. ..................................................... 331/111
[58] Field of Search .................... 331/111, 108 D, 143

[56] References Cited

U.S. PATENT DOCUMENTS

| | | | |
|---|---|---|---|
| 3,883,825 | 5/1975 | Cohen | 331/111 |
| 3,995,232 | 11/1976 | Laugesen | 331/108 D X |
| 4,001,722 | 1/1977 | Patel et al. | 331/111 |

Primary Examiner—Siegfried H. Grimm
Assistant Examiner—Edward P. Westin
Attorney, Agent, or Firm—P. J. Rasmussen; Allen L. R. Limberg; John M. O'Meara

[57] ABSTRACT

In a relaxation oscillator having its frequency determined by the charge rate of a capacitor, a switch means is controlled through a field effect transistor to discharge the capacitor at a predetermined charge level when channel current through the FET is reduced as voltage across the capacitor approaches the voltage supply level. The charge rate of the capacitor is substantially unaffected by the FET and substantially no power is drawn to control the switch means while the capacitor is charging. The duty cycle of the output level may be readily controlled in this oscillator without substantially affecting the low power attributes thereof.

18 Claims, 3 Drawing Figures

RELAXATION OSCILLATOR NOT RESTRICTED BY FET THRESHOLD

The present invention relates to relaxation oscillators in which the gate circuit of a field effect transistor (or FET) is used to sense the level to which a timing capacitor is charged.

A relaxation oscillator generates a sawtooth wave the period of which is determined by the time required to charge a capacitor during each cycle of oscillation. In prior art relaxation oscillators the level to which the timing capacitor is charged has been sensed by applying the voltage across the timing capacitor to the gate circuit of a common-source amplifier FET for biasing the drain-to-source channel of the FET into conduction as the level to which the capacitor is charged increases beyond a threshold voltage value, the conduction of the FET being used to actuate a switch for discharging the capacitor. This tends to be disadvantageous in the following regards. The amplitude of the sawtooth oscillations tends to be restricted to a value directly dependent upon the threshold voltage of the FET and so less than the operating voltage available to the oscillator. Further, the amplitude and thus the frequency of the oscillations tend to depend upon the threshold voltage of the FET, which is subject to substantial manufacturing variation.

A relaxation oscillator embodying the present invention avoids these undesirable tendencies by connecting the gate circuit of an FET in series with the timing capacitor between operating voltage supply terminals. The FET used to sense the level of charge on the timing capacitor is of a conductivity type such that its channel is maintained conductive while the timing capacitor is charged to a level approaching the operating potential, the absence of clamping action in the gate circuit of the FET permitting conduction in its channel without effecting the charging of the timing capacitor. The level of charge on the capacitor is, then, sensed indirectly, from measuring the difference between an operating potential voltage and the voltage across the capacitor rather than directly from measuring the voltage across the capacitor. In most operating circumstances the available operating voltage greatly exceeds the threshold voltage of the FET, particularly where the threshold voltage is selected to permit operation of the FET at the ultra-low current levels associated with weak inversion of the channel. The capacitor will be charged to voltages closely approaching the operating voltage in such operating circumstances, so the amplitude of the sawtooth voltage appearing across the timing capacitor depends primarily on operating voltage rather than the threshold voltage of the FET. Therefore, frequency of oscillation is also less dependent upon variation of the threshold voltage of the FET.

Figure 1:
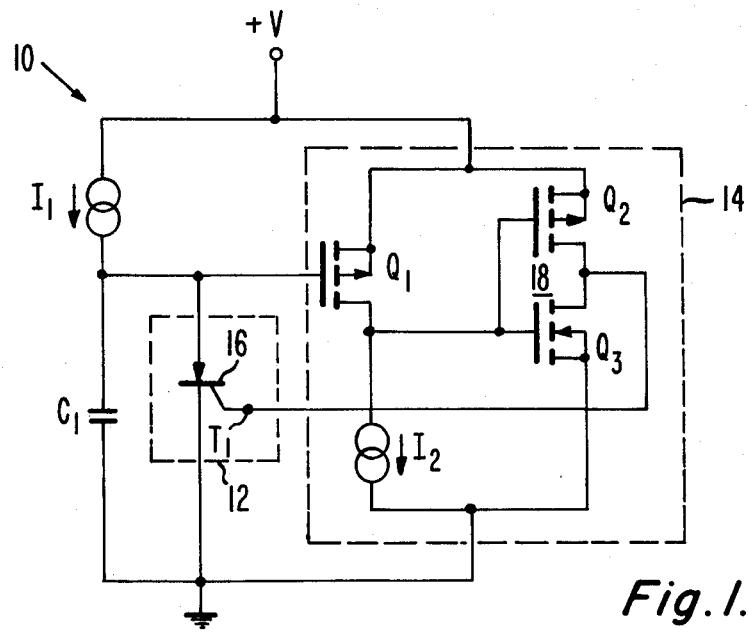
FIG. 1 is a block diagram for a relaxation oscillator embodying this invention wherein the schematic for each block element is shown in a preferred embodiment of the invention.

In the oscillator 10 of FIG. 1 a current source $I_1$ is connected to charge a capacitor $C_1$ from a voltage source $+V$ and a switch means 12 is disposed for discharging $C_1$. The switch means 12 becomes conductive when a turn-on signal is applied to its terminal $T_1$ and it demonstrates a hysteresis characteristic between its on and off conditions. A threshold means 14 is disposed for generating the switch means turn-on signal whenever $C_1$ reaches a predetermined charge level and terminating that signal when $C_1$ discharges below that predetermined charge level, while having substantially no affect on the charge rate of the capacitor and drawing substantially no power while the capacitor is charging.

As is conventional in many relaxation type oscillators, the charge level on $C_1$ controls the output signal of oscillator 10 and it continuously varies at the oscillation frequency between a low value when the switch means 12 changes from ON to OFF and a high value when the switch means 12 changes from OFF to ON. Because the switch means turn-on signal is supplied by the threshold means 14 whenever $C_1$ reaches the predetermined charge level, the high value output from oscillator 10 is equal to the predetermined charge level of $C_1$. Although a resistance may be series connected with the switch means 12 to adjust the discharge rate of $C_1$ and the oscillation frequency, $C_1$ rapidly discharges below the predetermined charge level so that the turn-on signal from the threshold means 14 is only applied for a very short duration. Subsequently, the hysteresis characteristic of the switch means 12 determines when it changes from ON to OFF conditioning the oscillator for the next cycle of operation. Although many embodiments of the invention are possible in regard to both the switch means 12 and the threshold means 14, circuitry for the preferred embodiments of these elements is also illustrated in FIG. 1. A silicon controlled rectifier (SCR) 16 is utilized as the switch means 12 having the charge level of $C_1$ applied to its anode and its cathode connected to the reference level (ground) side of $C_1$, while its gate is $T_1$ and receives the turn-on signal. The source-drain channel of an MOS transistor $Q_1$ and a constant current generator $I_2$ arranged as a current sink are series connected between $+V$ and ground, within the threshold means 14, along with circuit means 18 responsive to the reduction of current through the channel of the MOS transistor $Q_1$ below a threshold value for providing the switch means turn-on signal. A pair of complementary MOS transistors $Q_2$ and $Q_3$ are disposed in a conventional CMOS inverter arrangement within the circuit means. The gates of $Q_2$ and $Q_3$ are commonly connected between the drain-source channel of $Q_1$ and $I_2$, while the drain-source channels of $Q_2$ and $Q_3$ are series connected between $+V$ and ground. The gate of $Q_1$ is connected to the charge level of $C_1$, while the inverter output from between the drain-source channels of $Q_2$ and $Q_3$ is connected to supply the turn-on signal at $T_1$ of the switch means 14.

As soon as the SCR 16 becomes non-conductive (OFF condition of the switch means 12) current from $I_1$ starts charging $C_1$ toward the level of $+V$ and the drain-source channel of $Q_1$ becomes conductive from the negative gate-source voltage thereon to substantially apply $+V$ at the gates of $Q_2$ and $Q_3$. Consequently, the drain-source channel of $Q_3$ becomes conductive from the positive gate-source voltage thereon to substantially apply ground as the output of the CMOS inverter which serves to hold off the conductive condition of the SCR 16. The negative gate-source voltage on $Q_1$ decreases as the charge level on $C_1$ increases, until the drain-source channel current of $Q_1$ is reduced to lower the gate-source voltage on both $Q_2$ and $Q_3$. Then, the drain-source channel of $Q_2$ becomes conductive from a negative gate-source voltage thereon to substantially apply $+V$ as the output of the CMOS inverter which renders the SCR 16 conductive to discharge $C_1$. As $C_1$ discharges, the negative gate-source voltage on $Q_1$ increases until the drain-source channel thereof becomes conductive to terminate the turn-on signal being applied to the gate of SCR 16. However, SCR 16 remains conductive until the discharge of $C_1$ is no longer sufficient to support the holding current required to maintain conduction through the SCR 16.

Thereafter, the conductive condition of the SCR 16 continues to change at twice the frequency of the oscillator 10. This frequency is determined by the gate-source voltage that is required on $Q_1$ to reduce current flow in the channel thereof and by the holding current that is required to sustain conduction through the SCR 16, while the latter of these parameters also determines the hysteresis characteristic of the switching means 12. The charge rate of $C_1$ is unaffected by $Q_1$ because its gate presents only a capacitive load which draws no substantial current. Furthermore, ground is substantially applied at the output of the threshold means 14 while $C_1$ is charging over the greatest portion of each frequency cycle and therefore the threshold means 14 consumes substantially no power throughout this duration. Furthermore, the circuitry of FIG. 1 can be readily integrated on a monolithic chip wherein a pair of complementary bipolar transistors are disposed as the SCR 16 with their emitters separately connected as the anode and cathode, respectively, while the collector of each is connected to the base of the other and one such collector-base connection is connected as the gate of the SCR.

Because the drain of Q1 couples to the very high input impedance gates of ensuing MOS transistors Q2, Q3, the current that must be drawn by current sink $I_2$ to switch Q2 into conduction and Q3 out of conduction can be so small as to operate Q1 in the region of weak channel inversion. One may use a standard size MOS transistor as Q1 operating to overcome as little as 100 nanoamperes demand by current sink $I_2$, for reducing the source-to-gate voltage which must be applied to Q1 in order to condition it to supply a drain current that will overcome the current demand of current sink $I_2$ and thereby switch Q2 out of conduction and Q3 into conduction. Alternatively, the current demand imposed by current sink $I_2$ may be increased, e.g., to the 100 microamperes region, where Q1 is a standard size MOS transistor, to obtain a temperature-independent source-to-gate voltage at which Q1 will supply sufficient drain current to overcome the current demand of current sink $I_2$. However, such increase will increase the power consumption in the threshold means 14 and will increase the source-to-gate voltage required for switching.

Figure 2:
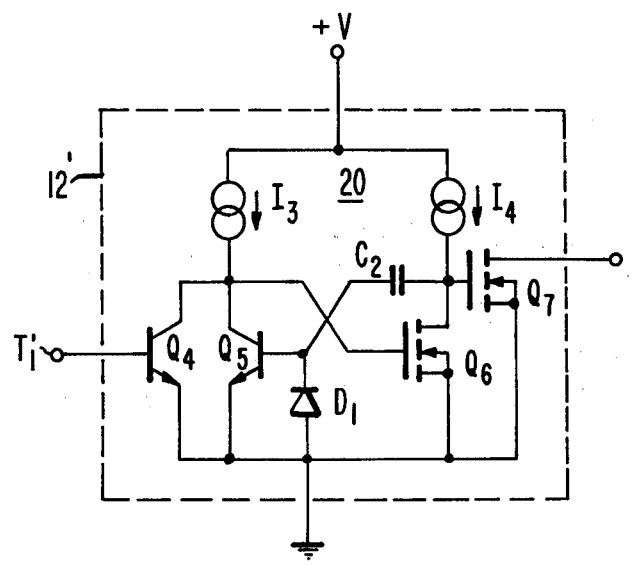
FIG. 2 is a schematic diagram of another switch means embodiment for modifying the oscillator of FIG. 1.

Another switch means 12' for use in a further embodiment of the invention is shown in FIG. 2 where the circuitry for a monostable multivibrator 20 is illustrated. Bipolar transistors $Q_4$ and $Q_5$ of the same conductivity type are disposed within the multivibrator 20 with their main conductive paths connected in parallel between a current source $I_3$ and ground.

The turn-on signal is applied to $T'_1$ at the base of $Q_4$, while the base of $Q_5$ is connected to a current source $I_4$ through a capacitor $C_2$ and also to ground through a diode $D_1$ poled oppositely to the base emitter junction of $Q_5$. $I_4$ is also connected to ground through the drain-source channel of an MOS transistor $Q_6$ and to the gate of another MOS transistor $Q_7$. The gate of $Q_6$ is connected to $I_3$ and assuming that switching means 12' is substituted for switching means 12 in FIG. 1, the drain-source channel of $Q_7$ connects across $C_1$ to discharge that capacitor. $+V$ is applied to both $I_3$ and $I_4$.

When no turn-on signal is applied to the multivibrator 20 at the base of $Q_4$, switch means 12' is maintained in its OFF condition and $C_1$ in FIG. 1 is allowed to charge. This is so because the drain-source channel of $Q_6$ becomes conductive from the positive gate-source voltage thereon and $C_2$ is discharged to render the drain-source channel of $Q_7$ non-conductive from the negative gate-source voltage thereon. When the threshold means 14 applies the turn-on signal at $T'_1$, the switch means 12' changes to its ON condition and $C_1$ is discharged. This is so because $Q_4$ becomes conductive to terminate the positive gate-source voltage on $Q_6$ which is thereby rendered non-conductive and $I_4$ starts charging $C_2$ towards the level of $+V$. Then the drain-source channel of $Q_7$ becomes conductive from the positive gate-source voltage thereon and $C_1$ is discharged. Due to the flow of displacement current while $C_2$ charges, a positive voltage develops at the base of $Q_5$ which then becomes conductive to hold $Q_6$ non-conductive after the turn-on signal has been terminated to render $Q_4$ nonconductive. When $C_2$ becomes fully charged and displacement current ceases to flow therethrough, conduction through $Q_5$ is terminated to render $Q_6$ conductive and $Q_7$ nonconductive so that the charging cycle of $C_1$ is initiated. $Q_6$ discharges $C_2$ in cooperation with $D_1$ during each charging period of $C_1$. Therefore, with switching means 12' substituted for switching means 12 in FIG. 1, $C_1$ is charged and discharged during each frequency cycle of the oscillator 10 and that frequency is determined by the charging time of $C_2$. Although the circuitry of multivibrator 20 is more complex than that of the SCR 16, it provides a well-defined reset function having a known hysteresis. Of course, a variable capacitor could be utilized for $C_2$ where it is desirable for the oscillator 10 to have an adjustable frequency.

Figure 3:
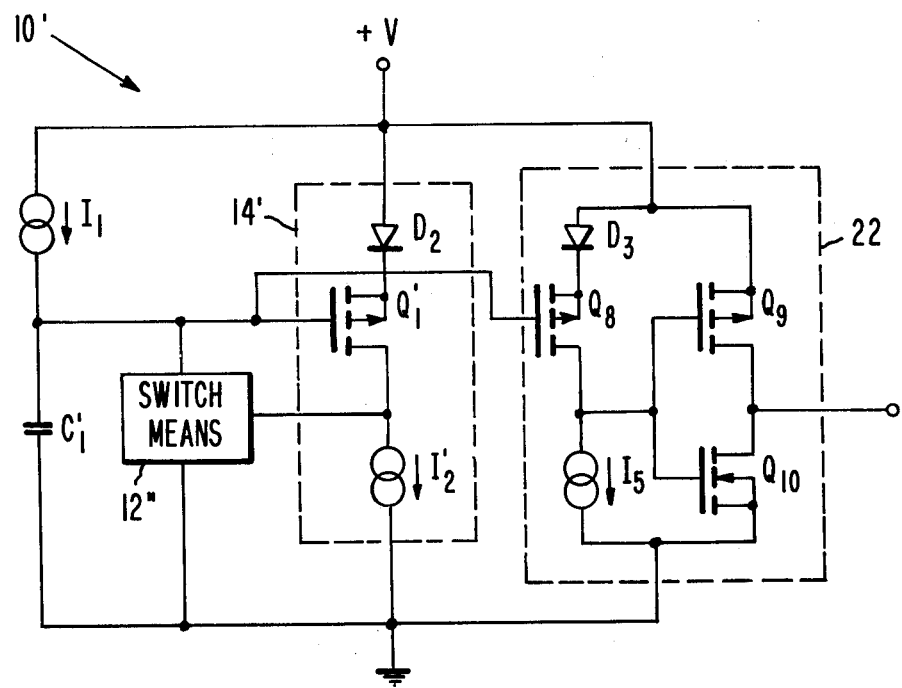
FIG. 3 is a schematic/block diagram for another embodiment of the invention having a duty cycle feature incorporated therein during each period of oscillation.

A duty cycle means 22 for producing an output during a portion of each frequency cycle from an oscillator 10' is shown in FIG. 3. Except for the duty cycle means 22 and the threshold means 14', the oscillator 10' is essentially identical to the oscillator 10 of FIG. 1 with its switching means 12" being any appropriate circuitry such as an SCR which responds to a negative gate signal. $Q'_1$ and $I'_2$ are series connected in the same manner within the threshold means 14' as was discussed previously regarding threshold means 14 except that a diode $D_2$ is connected between $+V$ and the drain-source channel of $Q'_1$ to conduct the current required by $I'_2$. Within the duty cycle means 22, the drain-source channel of an MOS transistor $Q_8$ is connected between $+V$ and ground through a diode $D_3$ and a current sink $I_5$ respectively. A pair of complementary MOS transistors $Q_9$ and $Q_{10}$ disposed in a conventional CMOS inverter arrangement are also included in the duty cycle means 22. The gates of $Q_9$ and $Q_{10}$ are commonly connected between $I_5$ and the drain-source channel of $Q_8$, while the drain-source channels of $Q_9$ and $Q_{10}$ are connected in series between $+V$ and ground. The charge level on $C'_1$ is applied to both the gates of $Q'_1$ and $Q_8$ while the output from the duty cycle means 22 is taken from between the drain-source channels of $Q_9$ and $Q_{10}$.

Oscillator 10' operates in substantially the same manner as was described previously regarding oscillator 10 of FIG. 1 to produce a continuously alternating charge level on $C'_1$. Although the structure of $Q'_1$ may differ from that of $Q_8$ and the structure of $I'_2$ may differ from that of $I_5$, to facilitate the operational description of the duty cycle means 22 within the oscillator 10' the structures of $Q'_1/Q_8$ and $I'_2/I_5$ will be assumed identical for this discussion. However, $D_3$ is structured to have a greater forward-bias junction voltage than $D_2$ such as by deriving the respective diode characteristics with semiconductor junctions having similar profiles but areas of different relative size. Therefore, whenever the switch means 12" turns off, $C'_1$ starts charging towards +V and the gate-source voltages on both $Q'_1$ and $Q_8$ are such that the drain-source channels of these transmitters are simultaneously conductive. $Q_{10}$ in the CMOS inverter is rendered conductive whenever $Q_8$ is conductive to substantially apply ground at the output of the duty cycle means 22. As the charge level on $C'_1$ approaches +V, $Q_8$ becomes non-conductive before $Q'_1$ because of the greater forward-bias voltage which is presented by $D_3$ relative to $D_2$. $Q_9$ in the CMOS inverter is rendered conductive whenever $Q_8$ is non-conductive to substantially apply +V at the output of the duty cycle means 22. Of course, when $C'_1$ reaches the predetermined charge level, $Q'_1$ in the threshold means 14' is rendered non-conductive to generate the negative turn-on signal for the switch means 12" and $C'_1$ is then discharged so that $Q'_1$ and $Q_8$ both become conductive again. The output of the duty cycle means 22 returns to substantially ground and another duty cycle period is started. Consequently, the duty cycle means 22 functions to produce a high output level for a short readily controlled portion of each oscillation period and that portion may be increased or decreased respectively, by increasing or decreasing the forward-bias voltage of $D_3$ relative to $D_2$.

Those skilled in the art will understand without further explanation that where the high output level portion of the output signal from the duty cycle means need not be of a particularly short interval, $D_2$ becomes unnecessary in the threshold means 14'. Furthermore, if sophisticated integrated circuit fabrication techniques were utilized to control the oxide thickness and/or the doping of $Q'_1$ relative to $Q_8$, the duty cycle output could be accomplished without either $D_2$ or $D_3$.

Although this invention has been disclosed herein by describing only a few embodiments thereof, it should be understood by those skilled in the art that numerous changes in the details of construction and the combination or arrangement of parts could be made in the described embodiments without departure from the true scope and spirit of the invention. Therefore, the present disclosure should be construed as illustrative rather than limiting.

What is claimed is:

1. In a relaxation oscillator of the type wherein first and second supply terminals receive reference and operating potentials, respectively; a timing capacitor includes first and second plates, with said first plate being connected to said first supply terminal and said second plate being connected to charging circuitry to receive current of a polarity tending to bring it closer to said operating potential; a threshold means generates a control signal when the voltage across said timing capacitor reaches a predetermined value; and a switch means selectively completes a conductive path between said first and second plates in response to said control signal, the improvement comprising:

said threshold means including a first MOS transistor having a gate electrode to which the voltage appearing at said second plate is applied, having a source electrode connected at said second supply terminal without substantial intervening impedance, having a drain electrode, and being of a conductivity type such that it is conductive while the voltage across said timing capacitor is smaller than said predetermined value and is decreasingly conductive while the voltage across said timing capacitor is larger than said predetermined value; and circuit means responsive to the reduction of current through the source-drain channel of said first MOS transistor when the voltage across said timing capacitor reaches said predetermined value, which current is reduced below a threshold value for providing said control signal.

2. A relaxation oscillator as recited in claim 1 characterized in that said circuit means comprises a constant current generator connected between the drain electrode of said first MOS transistor and said first supply terminal, the constant output level of said current generator being equal to said threshold value.

3. A relaxation oscillator as recited in claim 2 wherein said circuit means further includes a MOS transistor amplifier having an input directly connected at the junction between said drain electrode of said field effect transistor and said constant current generator and having an output for producing said control signal, said amplifier providing direct current isolation of said junction and detection of the resultant junction voltage.

4. A relaxation oscillator as recited in claim 3 wherein said amplifier is an inverting complementary MOS transistor amplifier.

5. A relaxation oscillator as recited in any previous claim wherein said switch means includes a monostable multivibrator having its input connected to receive said control signal and its output connected to provide said conductive path through a MOS transistor for a predetermined length of time subsequent to the voltage across said capacitor reaching said predetermined value.

6. A relaxation oscillator as recited in claim 1 wherein said threshold means further comprises a second MOS transistor having gate and source electrodes connected in parallel with those of said first MOS transistor and having a drain electrode connected to provide an output signal, said second MOS transistor being arranged to exhibit a different threshold gate-source voltage than that of said first MOS transistor.

7. A relaxation oscillator as recited in claim 6 wherein the source electrode circuits of said first and second MOS transistors each include a respective diode to provide said different threshold gate-source voltages.

8. In a relaxation oscillator of the type wherein first and second supply terminals receive reference and operating potentials, respectively; a timing capacitor includes first and second plates, with said first plate being connected to said first supply terminal and said second plate being connected to charging circuitry to receive current of a polarity tending to bring it closer to said operating potential; a threshold means generates a control signal when the voltage across said timing capacitor reaches a predetermined value; and a switch means selectively completes a conductive path between said first and second plates in response to said control signal, the improvement comprising:

said threshold means including a first MOS transistor having a gate electrode to which the voltage appearing at said second plate is applied, having a source electrode connected to said second supply terminal, having a drain electrode, and being of a conductivity type such that it is conductive while the voltage across said timing capacitor is smaller than said predetermined value and is decreasingly conductive while the voltage across said timing capacitor is larger than said predetermined value;

circuit means responsive to the reduction of current through the source-drain channel of said first MOS transistor when the voltage across said timing capacitor reaches said predetermined value, which current is reduced below a threshold value for providing said control signal; and constant current generator means included within said circuit means and connected between the drain electrode of said first MOS transistor and said first supply terminal, the constant output level of said current generator being equal to said threshold value.

9. A relaxation oscillator as recited in claim 8 wherein said circuit means further includes a MOS transistor amplifier having an input directly connected at the junction between said drain electrode of said field effect transistor and said constant current generator and having an output for producing said control signal, said amplifier providing direct current isolation of said junction and detection of the resultant junction voltage.

10. A relaxation oscillator as recited in claim 9 wherein said amplifier is an inverting complementary MOS transistor amplifier.

11. A relaxation oscillator as recited in claim 8 wherein said threshold means further comprises a second MOS transistor having gate and source electrodes connected in parallel with those of said first MOS transistor and having a drain electrode connected to provide an output signal, said second MOS transistor being arranged to exhibit a different threshold gate-source voltage than that of said first MOS transistor.

12. A relaxation oscillator as recited in claim 11 wherein the source electrode circuits of said first and second MOS transistors each include a respective diode to provide said different threshold gate-source voltages.

13. In a relaxation oscillator of the type wherein first and second supply terminals receive reference and operating potentials, respectively; a timing capacitor includes first and second plates, with said first plate being connected to said first supply terminal and said second plate being connected to charging circuitry to receive current of a polarity tending to bring it closer to said operating potential; a threshold means generates a control signal when the voltage across said timing capacitor reaches a predetermined value; and a switch means selectively completes a conductive path between said first and second plates in response to said control signal, the improvement comprising:

said threshold means including a first MOS transistor having a gate electrode to which the voltage appearing at said second plate is applied, having a source electrode connected to said second supply terminal, having a drain electrode, and being of a conductivity type such that it is conductive while the voltage across said timing capacitor is smaller than said predetermined value and is decreasingly conductive while the voltage across said timing capacitor is larger than said predetermined value;

circuit means responsive to the reduction of current through the source-drain channel of said first MOS transistor when the voltage across said timing capacitor reaches said predetermined value, which current is reduced below a threshold value for providing said control signal; and said switch means including a monostable multivibrator having its input connected to receive said control signal and having its output connected to provide said conductive path through a second MOS transistor for a predetermined length of time subsequent to the voltage across said capacitor reaching said predetermined value.

14. A relaxation oscillator as recited in claim 13 wherein said threshold means further comprises a third MOS transistor having gate and source electrodes connected in parallel with those of said first MOS transistor and having a drain electrode connected to provide an output signal, said third MOS transistor being arranged to exhibit a different threshold gate-source voltage than that of said first MOS transistor.

15. A relaxation oscillator as recited in claim 14 wherein the source electrode circuits of said first and third MOS transistors each include a respective diode to provide said different threshold gate-source voltages.

16. A relaxation oscillator as recited in claim 13 characterized in that said circuit means comprises a constant current generator connected between the drain electrode of said first MOS transistor and said first supply terminal, the constant output level of said current generator being equal to said threshold value.

17. A relaxation oscillator as recited in claim 16 wherein said circuit means further includes a MOS transistor amplifier having an input directly connected at the junction between said drain electrode of said field effect transistor and said constant current generator and having an output for producing said control signal, said amplifier providing direct current isolation of said junction and detection of the resultant junction voltage.

18. A relaxation oscillator as recited in claim 17 wherein said amplifier is an inverting complementary MOS transistor amplifier.

* * * * *